(12) United States Patent
Kong et al.

(10) Patent No.: US 7,582,525 B2
(45) Date of Patent: Sep. 1, 2009

(54) METHOD FOR FABRICATING CAPACITOR OF SEMICONDUCTOR MEMORY DEVICE USING AMORPHOUS CARBON

(75) Inventors: Keun-Kyu Kong, Kyoungki-do (KR); Jae-Chang Jung, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 380 days.

(21) Appl. No.: 11/314,068

(22) Filed: Dec. 20, 2005

(65) Prior Publication Data
US 2006/0141736 A1 Jun. 29, 2006

(30) Foreign Application Priority Data
Dec. 28, 2004 (KR) .................. 10-2004-0113514
Dec. 28, 2004 (KR) .................. 10-2004-0113515

(51) Int. Cl.
H01L 21/8242 (2006.01)
(52) U.S. Cl. .................. 438/253; 257/301; 257/306; 257/E21.396; 438/243; 438/244; 438/386; 438/387
(58) Field of Classification Search .................. 257/301, 257/306, E21.396; 438/243, 244, 253, 386, 438/387
See application file for complete search history.

(56) References Cited

U.S. PATENT DOCUMENTS

| 6,218,308 | B1 | 4/2001 | Lou |
| 2001/0005631 | A1* | 6/2001 | Kim et al. .................. 438/689 |
| 2003/0032241 | A1 | 2/2003 | Seo et al. |
| 2003/0122174 | A1* | 7/2003 | Fukuzumi .................. 257/306 |
| 2004/0108536 | A1 | 6/2004 | Lee et al. |
| 2004/0248361 | A1 | 12/2004 | Oh et al. |
| 2004/0248362 | A1 | 12/2004 | Nakamura et al. |

FOREIGN PATENT DOCUMENTS

| CN | 1365142 | 8/2002 |
| KR | 1998-021248 | 6/1998 |
| KR | 10-2004-0105949 | 12/2004 |
| KR | 10-2005-0058916 | 6/2005 |
| KR | 10-2006-0038626 | 5/2006 |

* cited by examiner

Primary Examiner—Asok K Sarkar
(74) Attorney, Agent, or Firm—Blakely, Sokoloff, Taylor & Zafman LLP

(57) ABSTRACT

A method for fabricating a semiconductor device is provided. The method includes: forming an inter-layer insulation layer on a substrate; forming storage node contact plugs penetrating into the inter-layer insulation layer; forming a stack structure formed by stacking a first protective barrier layer and a sacrificial layer on the inter-layer insulation layer; performing an etching process to the first protective barrier layer and the sacrificial layer in a manner to have a trenches opening upper portions of the storage node contact plugs; forming storage nodes having a cylinder type inside of the trenches; forming a second protective barrier layer filling the inside of the storage nodes having the cylinder type; removing the sacrificial layer through performing a wet dip-out process; removing the first protective barrier layer and the second protective barrier layer; and sequentially forming a dielectric layer and a plate node on the storage nodes.

17 Claims, 9 Drawing Sheets

METHOD FOR FABRICATING CAPACITOR OF SEMICONDUCTOR MEMORY DEVICE USING AMORPHOUS CARBON

FIELD OF THE INVENTION

The present invention relates to a technology of fabricating a semiconductor device; and more particularly, to a method for fabricating a semiconductor memory device including a cylinder type capacitor.

DESCRIPTION OF RELATED ARTS

As a minimum line width and a degree of integration of a semiconductor device have been increased, an area in which a capacitor is formed has been decreased. Accordingly, although the area in which a capacitor is formed has been decreased, the capacitor inside of a cell should ensure the least required amount per cell. Thus, there have been suggested various methods to form a capacitor that has high capacitance within a limited area. One suggested method is to form a dielectric layer with a high electric permittivity such as $Ta_2O_5$, $Al_2O_3$ or $HfO_2$, replacing a silicon dioxide layer having a dielectric constant ($\in$) of 3.8 and a nitride layer having a dielectric constant ($\in$) of 7. Another suggested method is to effectively increase an area of a bottom electrode by forming the bottom electrode with a three-dimensional type such as a cylinder type or a concave type, or by increasing an effective surface area of a bottom electrode 1.7 to 2 times more through growing metastable polysilicon (MPS) grains on the surface of the bottom electrode. Also, a metal-insulator-metal (MIM) method forming a storage node and a plate node by using a metal layer has been suggested.

Recently, for a capacitor with a MIM structure of dynamic random access memory (DRAM) having integration more than 128M bits, a method for applying a titanium nitride (TiN) layer to a storage node is suggested.

FIGS. 1A and 1B are cross-sectional views illustrating a conventional method for forming a storage node by using TiN when a conventional semiconductor memory device having a cylinder type MIM capacitor is fabricated.

As shown in FIG. 1A, to form the semiconductor memory device, an inter-layer insulation layer 12 is formed on a substrate 11 completed with processes for forming a word line, a transistor and a bit line. The inter-layer insulation layer 12 is etched, thereby forming storage node contact holes exposing predetermined portions of the substrate 11. Then, a plurality of storage node contact plugs 13 are formed by burying polysilicon into the storage node contact holes.

Next, an etch barrier layer 14 and a sacrificial layer 15 are deposited on the storage node contact plugs 13 and the inter-layer insulation layer 12. At this time, the etch barrier layer 14 can be formed with a nitride layer and serves a role of an etch barrier during a subsequent etching process subjected to the sacrificial layer 15. Furthermore, the sacrificial layer 15 is formed with use of a silicon oxide layer such as a borophosphosilicate glass (BPSG) layer or an undoped silicate glass (USG) layer and wherein, the sacrificial layer 15 serves a role in providing a three-dimensional structure that will be formed as a storage node.

Subsequently, a mask process, a dry etching process subjected to the sacrificial layer 15 and another dry etching process subjected to the etch barrier layer are employed, thereby forming a plurality of trenches 16 having a three-dimensional structure.

Ti is deposited over the plurality of trenches 16 through a chemical vapor deposition (CVD) method or a physical vapor deposition (PVD) method. Afterwards, an annealing process is performed. Then, titanium silicide (TiSi) is formed and Ti that has not yet reacted to the annealing process is removed. Thus, a plurality of barrier metal layers 17 are formed through the above mentioned steps.

TiN supposed to be used as a storage node on the resulting structure provided with the barrier metal layers 17 is deposited. Afterwards, a storage node isolation process is performed, thereby forming a plurality of TiN storage nodes 18 having a cylinder type inside of the trenches 16.

As described above, it is possible to reduce a resistance of a surface which the TiN storage nodes 18 contact with the storage node contact plugs 13 by forming the barrier metal layers 17 with use of TiSi on surfaces of the storage node contact plugs 13 formed with polysilicon.

Next, as shown in FIG. 1B, the sacrificial layer 15 is subjected to a wet dip-out process, thereby exposing an inner wall and an outer wall of each of the TiN storage nodes 18 having a cylinder type. Lastly, a dielectric layer and a plate node are sequentially formed on the TiN storage nodes 18, thereby completing MIM capacitors having a cylinder type.

In accordance with the above described conventional method, during performing the wet dip-out process, a wet chemical tends to penetrate into a portion of the inter-layer insulation layer 12 beneath the etch barrier layer 14 in a certain portion of a wafer, thereby generating a wet damage 20. Herein, a reference numeral 19 denotes the penetration of the wet chemical. The wet damage 20 is typically called a bunker shaped defect. Furthermore, in accordance with the conventional method, a wet chemical penetrates along a surface which the nitride layer used as the etch barrier layer 14 contacts with the TiN storage nodes 18 and thus, a bunker shaped defect also can be formed.

Since the TiN used as the storage nodes 18 typically has a columnar structure, the wet chemical penetrates into crystal grains of the TiN storage nodes 18 contacted with the storage node contact plugs 13 at the certain portion of the wafer. Thus, the above described bunker shaped defect 20 is formed.

Not only the bunker shaped defect 20 is a direct factor causing degradation in a refresh property, i.e., an IDD fail, but also a chip itself corresponding to the bunker shaped defect 20 is turned out to be a fail right after the generation of the bunker shaped defect 20. Particularly, the bunker shaped defect 20 has not been generated in a silicon insulator silicon (Si) using polysilicon but is a problem of TiN itself. Thus, the bunker shaped defect 20 is a considered as a critical problem which is not avoidable as long as TiN is applied to the storage nodes of the MIM capacitor of the DRAM capacitor.

SUMMARY OF THE INVENTION

It is, therefore, an object of the present invention to provide a method for fabricating a semiconductor device capable of preventing a bunker shaped defect from being caused by that a wet chemical provides an attack on a lower structure during performing a wet dip out process employed during fabricating a capacitor having a cylinder type storage node.

In accordance with one aspect of the present invention, there is provided a method for fabricating a semiconductor device, including: forming an inter-layer insulation layer on a substrate; forming a plurality of storage node contact plugs penetrating into the inter-layer insulation layer; forming a stack structure formed by stacking a first protective barrier layer and a sacrificial layer on the inter-layer insulation layer; performing an etching process to the first protective barrier layer and the sacrificial layer in a manner to have a trenches opening upper portions of the storage node contact plugs;

forming a plurality of storage nodes having a cylinder type inside of the trenches; forming a second protective barrier layer filling the inside of the storage nodes having the cylinder type; removing the sacrificial layer through performing a wet dip-out process; removing the first protective barrier layer and the second protective barrier layer; and sequentially forming a dielectric layer and a plate node on the storage nodes.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

Hereinafter, detailed descriptions of certain embodiments of the present invention will be provided with reference to the accompanying drawings.

FIGS. 2A to 2G are cross-sectional views illustrating a method for fabricating a semiconductor device having a cylinder type MIM capacitor in accordance with a specific embodiment of the present invention.

Figure 1A:
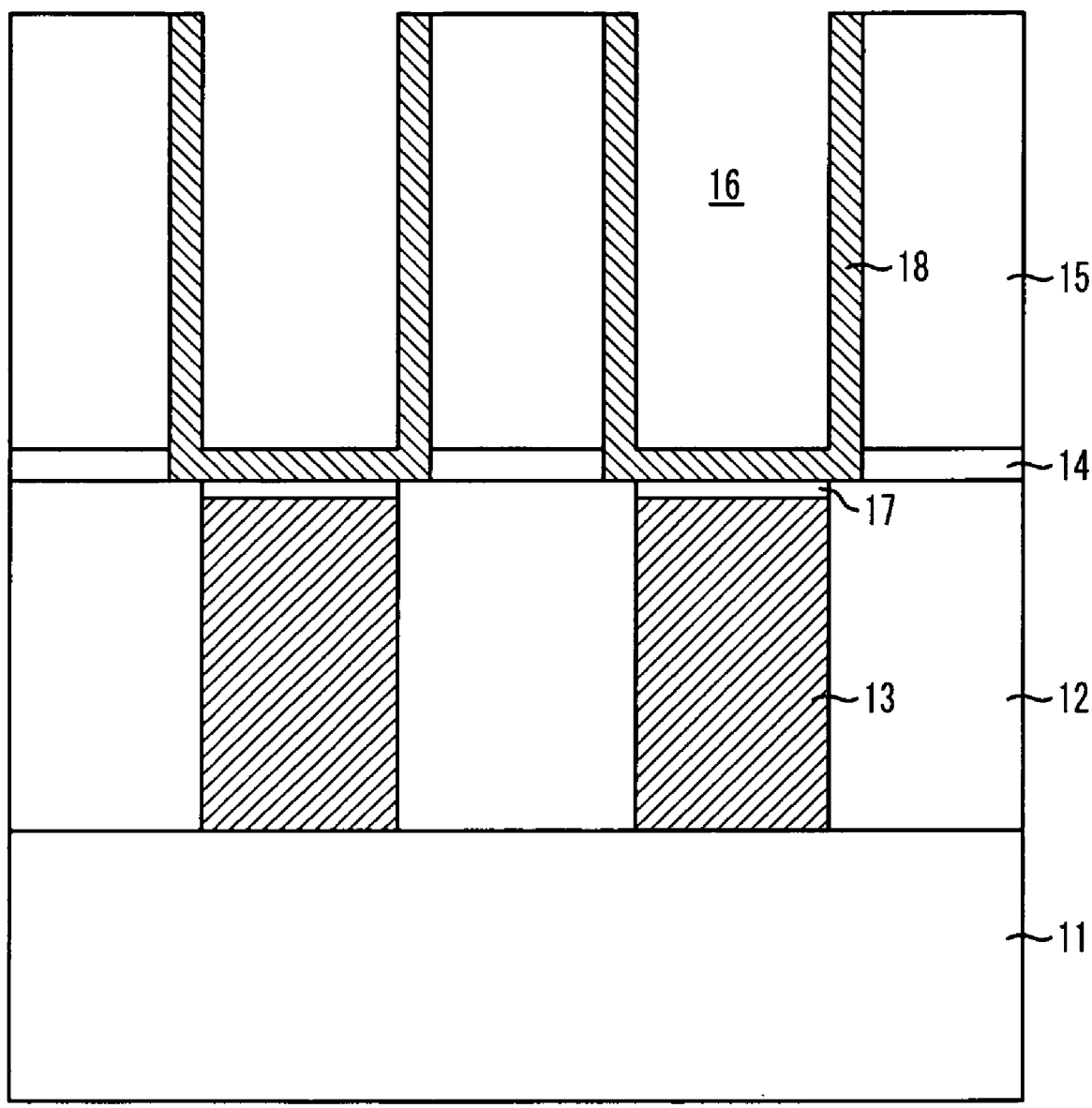
FIGS. 1A and 1B are cross-sectional views illustrating a conventional method for fabricating a semiconductor device having a cylinder type metal-insulator-metal (MIM) capacitor.
Figure 1B:
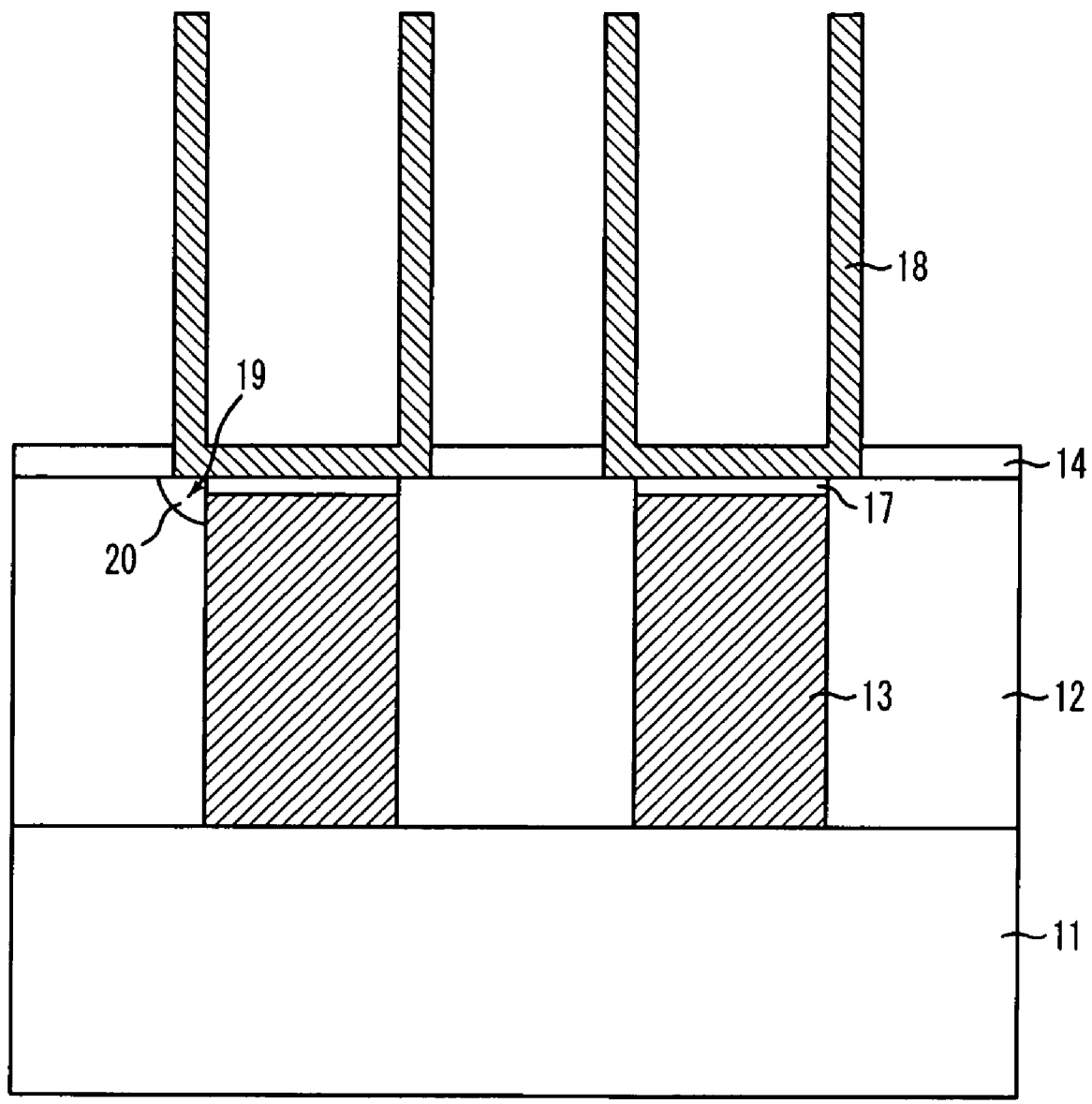
Figure 2A:
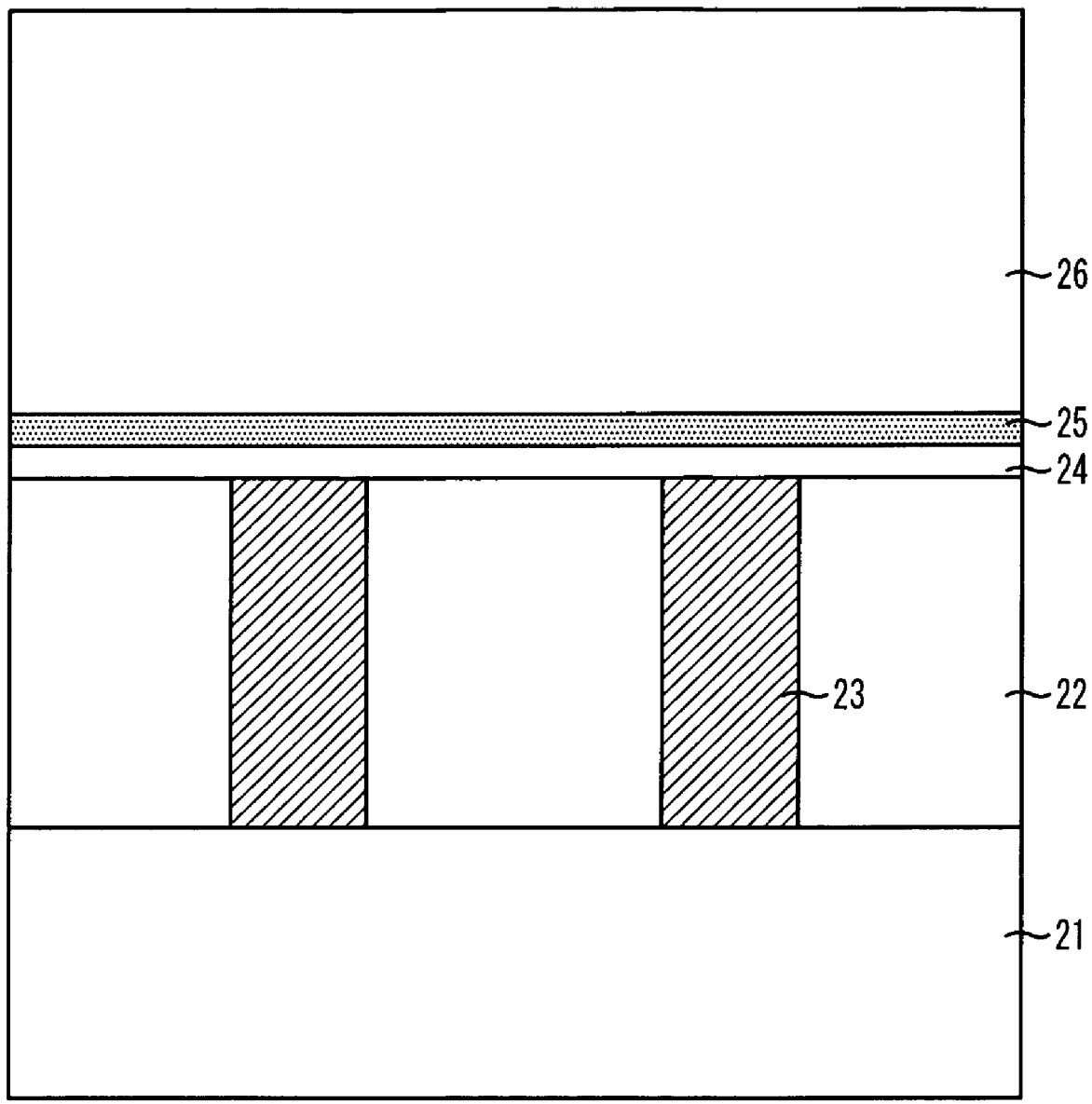
FIGS. 2A to 2G are cross-sectional views illustrating a method for fabricating a semiconductor device having a cylinder type MIM capacitor in accordance with a specific embodiment of the preset invention.

As shown in FIG. 2A, an inter-layer insulation layer 22 is formed on a substrate 21. Afterwards, a plurality of storage node contact holes (not shown) penetrating the inter-layer insulation layer 22 are formed and the then, a plurality of storage node contact plugs 23 burying into the storage node contact holes are formed. The inter-layer insulation layer 22 has a multiple layer structure because before the inter-layer insulation layer 22 is formed, a transistor including a word line and a bit line process are provided.

The plurality of storage node contact plugs 23 are formed depositing a polysilicon layer until the storage node contact holes are filled and performing an etch back process or a chemical mechanical polishing (CMP) process.

Next, on the inter-layer insulation layer 22 which the storage node contact plugs 23 are buried, an etch barrier layer 24, a first protective barrier layer 25 and a sacrificial layer 26 are sequentially formed.

Herein, the etch barrier layer 24 as serving a role of an etch barrier during a subsequent dray etching process subjected to the sacrificial layer 26 is formed with use of a nitride layer. The first protective barrier layer 25 is formed with use of amorphous carbon to prevent a penetration of a wet chemical into a lower structure during a subsequent wet dip-out process. The sacrificial layer 26 is formed by using a borophosphosilicate (BPSG) glass layer, an undoped silicate glass (USG) layer, a tetraethyl orthosilicate (TEOS) layer or a high density plasma (HDP) layer to provided a three-dimensional structure where storage nodes are supposed to be formed.

Amorphous carbon used as the first protective barrier layer 25 is formed at a temperature ranging from approximately 50° C. to approximately 600° C. in a thickness ranging from approximately 5 nm to approximately 1,000 nm.

Figure 2B:
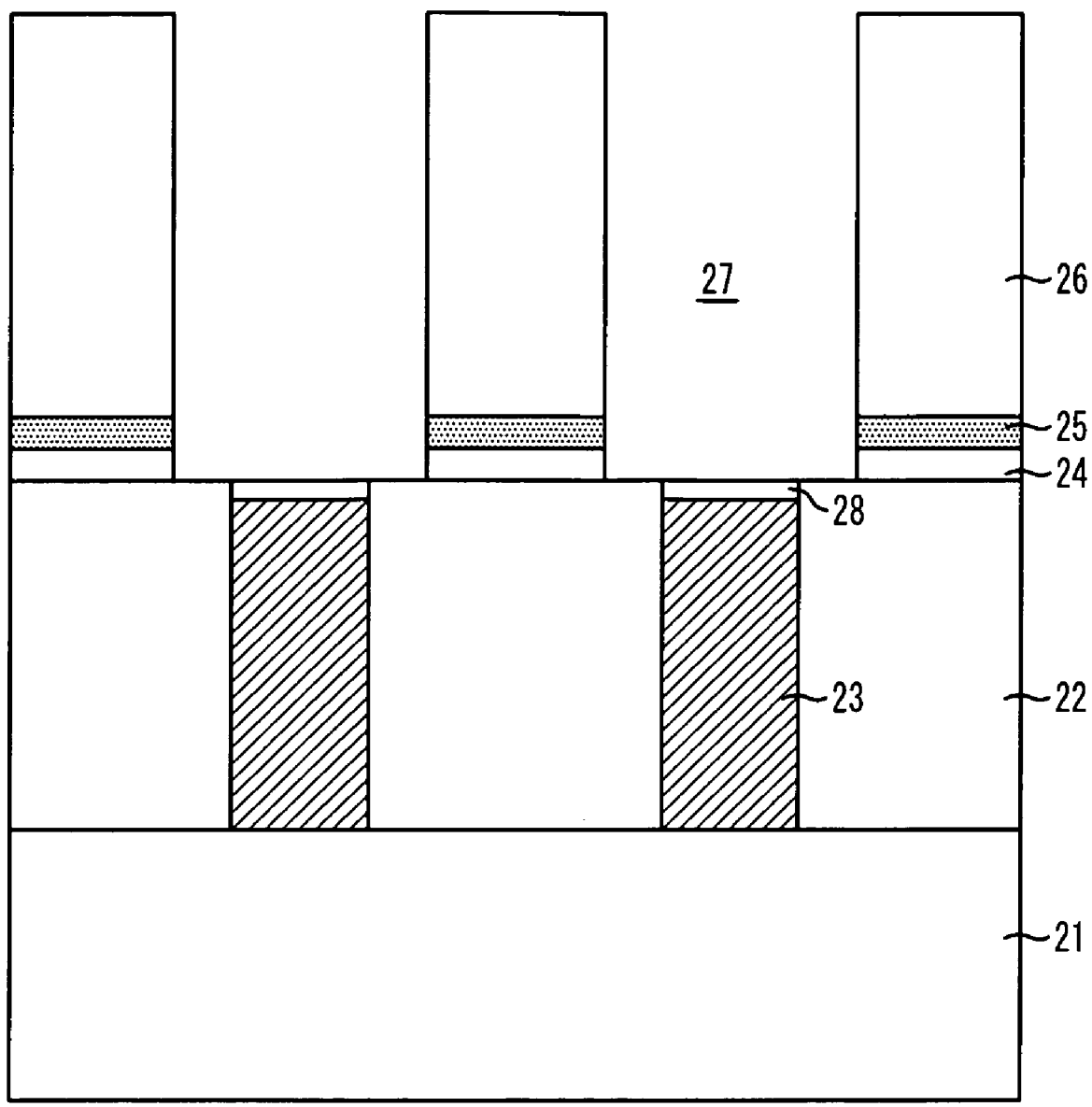

As shown in FIG. 2B, dry etching processes individually subjected to the sacrificial layer 26, the first wet attach barrier layer 25 and the etch barrier layer 24 are sequentially performed, thereby forming a plurality of trenches 27 opening upper portion of the storage node contact plugs 23.

During forming the trenches 27, a mask is formed on the sacrificial layer 26 by using a photoresist layer and then, the dry etching processes are performed to the sacrificial layer 26 and the first wet attach barrier layer 25 by using the mask. Afterwards, the mask is removed and then, the etch barrier layer 24 is selectively subjected to the dry etching process. Meanwhile, in case that a height of the sacrificial layer 26 increases, a hard mask formed with polysilicon can be introduced during performing the etching process to the sacrificial layer 26 to easily perform the etching process.

Next, before forming TiN storage nodes, a plurality of barrier metal layers 28 are formed. The plurality of barrier metal layers 28 are made of titanium silicide (TiSi). The plurality of barrier metal layers 28 are formed as follows. First, titanium (Ti) is deposited through a physical vapor deposition (PVD) method or a chemical vapor deposition (CVD) method on an entire surface including the trenches 27. Then, an annealing process is performed, thereby forming TiSi. Ti that has not yet reacted to the annealing process is removed. Finally, the plurality of barrier metal layers 28 are formed. Herein, TiSi used as the plurality of barrier metal layers 28 is formed by reacting silicon (Si) of polysilicon used as the storage node contact plugs 23 to Ti. TiSi is not formed in an insulation material of the storage node contact plugs 23.

As described above, if TiSi used as the barrier metal layers 28 decreases a resistance of a surface which the storage node contact plugs 23 contact to subsequent TiN storage nodes.

Figure 2C:
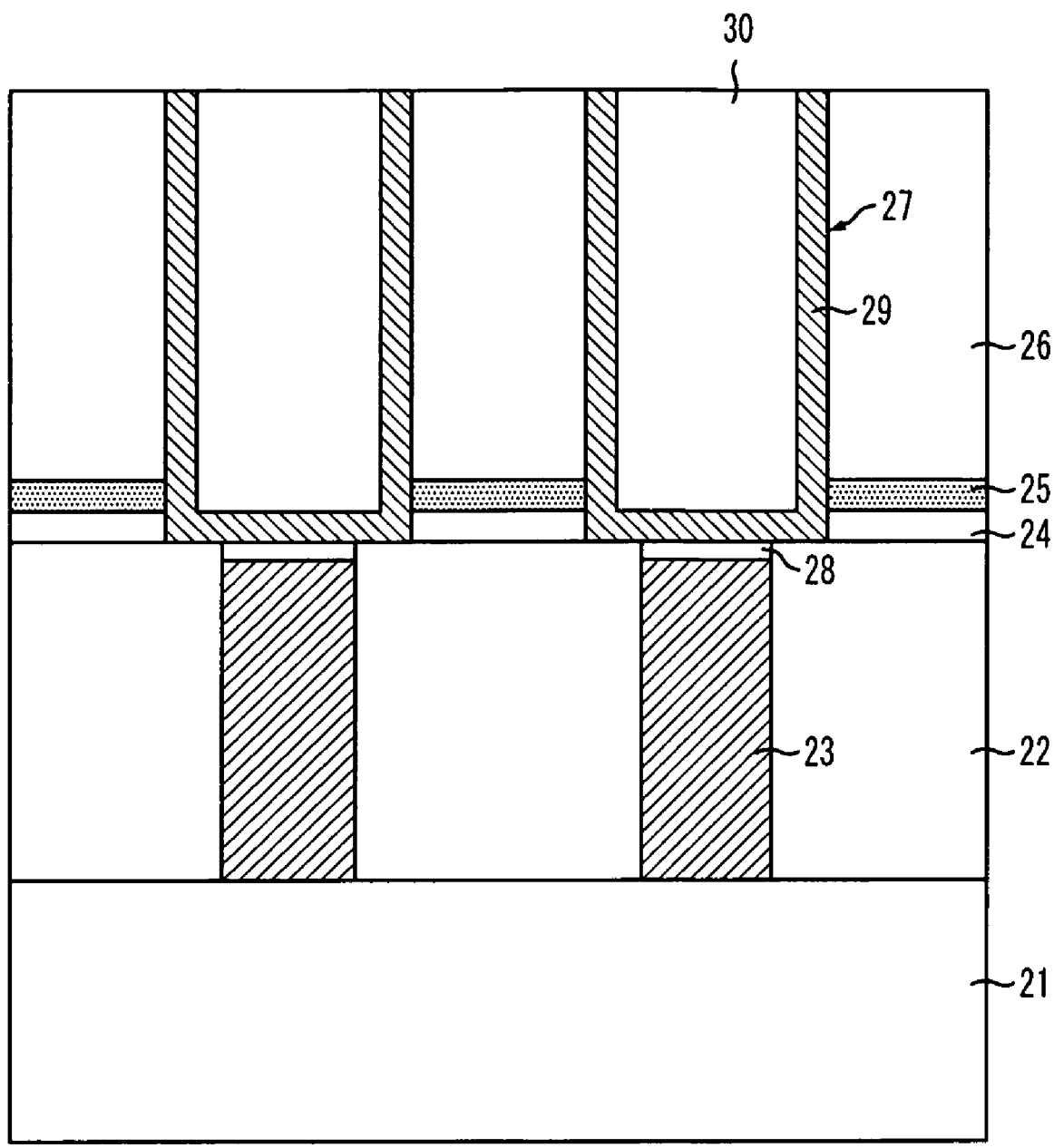

As shown in FIG. 2C, a storage node isolation process is employed, thereby forming a plurality of TiN storage nodes 29 having a cylinder type inside of the trenches 27.

As for the storage node isolation process, on a surface of the sacrificial layer 26 including the trenches 27, TiN to be used as the storage nodes is deposited. At this time, TiN is deposited through a CVD method, a PVD method or an atomic layer deposition (ALD) method.

Next, until the trenches 27 are filled, a first photoresist layer 30 is formed on the TiN layer.

At this time, the first photoresist layer 30 serves a role of a passivation layer to protect inside of the trenches 27 during a subsequent storage node isolation process. In addition to the first photoresist layer 30, an oxide layer such as a USG layer can be used for the passivation layer.

Next, the first photoresist layer 30 is subjected to an etch back process and thus, the first photoresist layer 30 on the sacrificial layer 26 is removed. Accordingly, the first photoresist layer 30 remains only inside of the trenches 27 and thus, TiN formed on the remaining portion except for the trenches 27, i.e., the surface of the sacrificial layer 26, is exposed.

As described above, the first photoresist layer 30 remains by performing an etch back process and then, TiN of the surface of the sacrificial layer 26 except for the trenches 27 is subjected to an etch back process or a CMP process, thereby forming a plurality of TiN storage nodes 29.

As described above, during the storage node isolation process, when TiN is removed by using the etch back process or the CMP process, there is a possibility that an impurity such as an abrasive or an etched particle is attached to the inside of the TiN storage nodes 29. Thus, it is preferred to perform the storage node isolation process after filling the inside of the trenches 27 by using the first photoresist layer 30 having good step coverage.

Figure 2D:
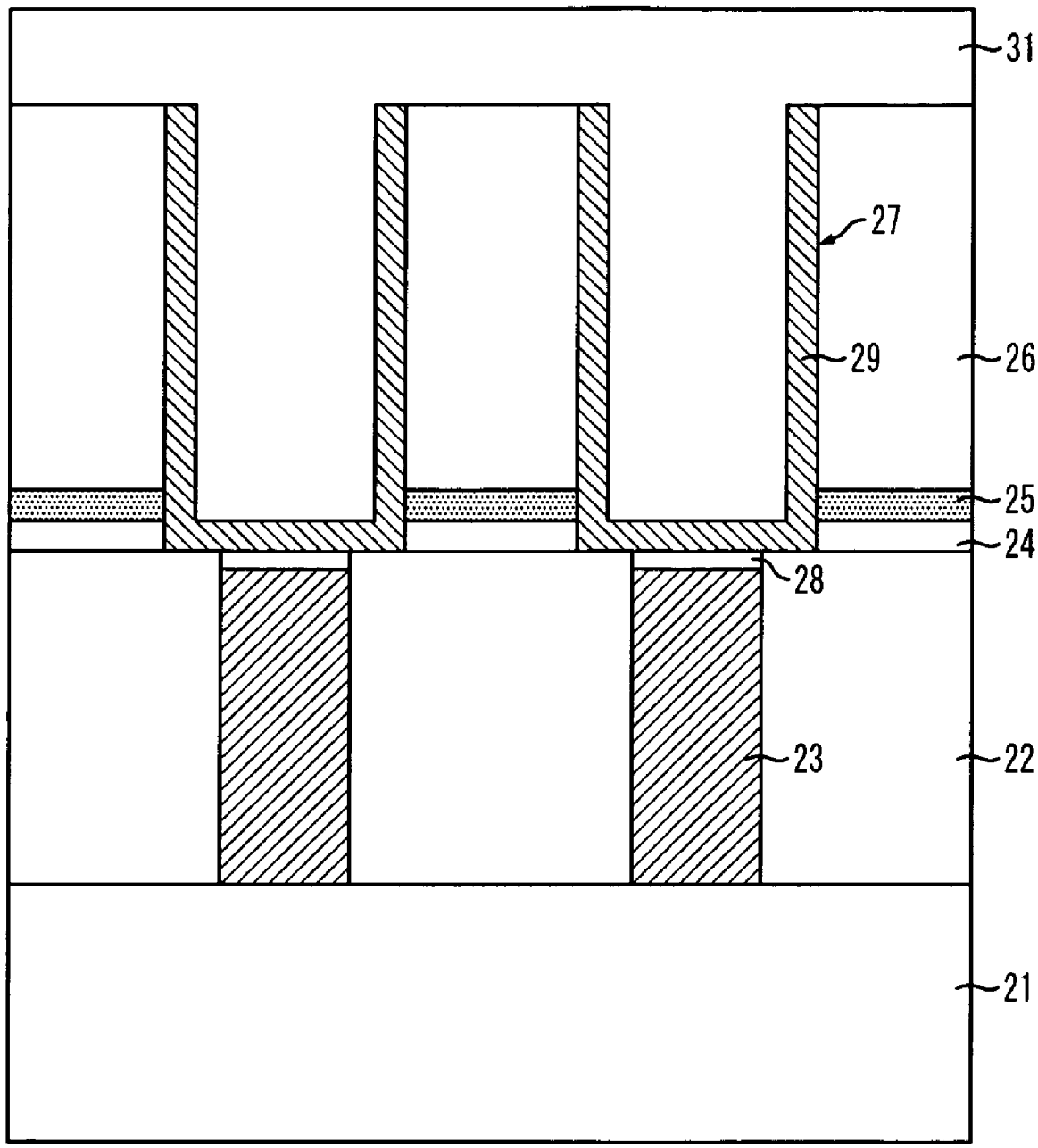

As shown in FIG. 2D, the first photoresist layer 30 remaining on upper portions of the TiN storage nodes 29 is subjected to a stripping process.

Next, a second protective barrier layer 31 is deposited on an entire surface until the cylinder type TiN storage nodes 29 exposed by removing the first photoresist layer 30 are filled.

At this time, the second protective barrier layer 31 is introduced to prevent the wet chemical from penetrating into the inside of the cylinder type TiN storage nodes 29 during performing a subsequent wet dip-out process and thus, can be formed with use of amorphous carbon or a second photoresist layer.

Figure 2E:
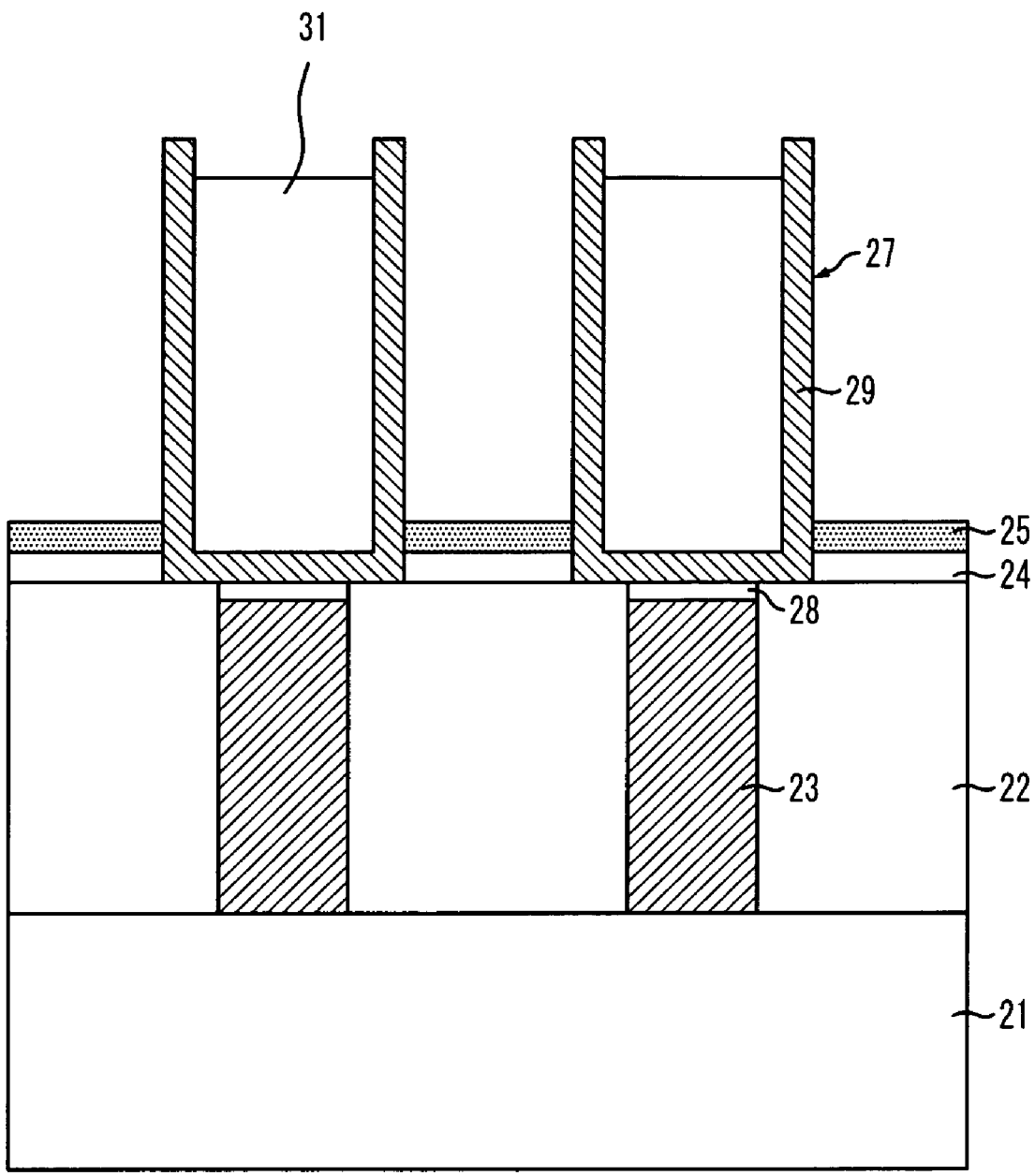

As shown in FIG. 2E, in case of that the second protective barrier layer 31 is formed with use of amorphous carbon, the amorphous carbon used as the second protective barrier layer 31 is selectively removed through a descum process and thus, the second protective barrier layer 31 remains in a type to fill the inside of the TiN storage nodes 29. At this time, a plasma state of oxygen ($O_2$) gas is used to selectively remove the second protective barrier layer 31.

In case of forming the second protective barrier layer 31 with use of the second photoresist layer, as shown in FIG. 2E, a blank exposure process is performed to the second protective barrier layer 31. Afterwards, the second wet protective layer 31 subjected to the blank exposure process is developed. Thus, the second wet protective layer 31 remains in a type to fill the inside of the TiN storage nodes 29. Herein, the blank exposure process uses an immersion exposure technology.

At this time, the aforementioned first photoresist layer 30 and the second protective barrier layer 31 are the identical photoresist layer and thus, according to an exposure light source, one of a photoresist layer for KrF, a photoresist for ArF, a photoresist layer for an electron-beam, a photoresist layer for an X-ray and a photoresist layer for extreme ultraviolet (EUV) and a photoresist layer for an ion beam can be used as the first photoresist layer 30 and the second protective barrier layer 31.

After the second protective barrier layer 31 is selectively removed or is subjected to the blank exposure and developing processes as described above, a surface of the sacrificial layer 26 and upper portions of the TiN storage nodes 29 are exposed.

Next, the sacrificial layer 26 is removed by performing a full wet dip-out process. At this time, a hydrogen fluoride (HF) solution is used to remove the sacrificial layer 26.

As the wet chemical, i.e. the HF solution, used during performing the full wet dip-out process removes the sacrificial layer 26, the HF solution can penetrate into the TiN storage nodes 29 having a crystal grain structure weak to the wet chemical. However, in accordance with the present invention, since the first wet attack barrier layer 25 is formed beneath the sacrificial layer 26 and the second protective barrier layer 31 is formed inside of the cylinders beforehand, the HF solution cannot penetrate into the TiN storage nodes 29.

That is, the amorphous carbon used for the first and the second protective barrier layers 25 and 31 or the second photoresist layer is a material having selectivity with respect to the wet chemical such as the HF solution and thus, is not etched by the HF solution during performing the wet dip-out process.

Accordingly, by introducing the first wet attack barrier layer 25, it is possible to prevent the wet chemical from penetrating along a surface which the etch barrier layer 24 contact to the TiN storage nodes 29 on an outer wall of each of the cylinder type TiN storage node 29. In addition, it is possible to prevent the wet chemical from penetrating into a bottom surface of the cylinder type TiN storage node 29 by introducing the second protective layer 31 on an inner wall of the cylinder type TiN storage nodes 29.

Figure 2F:
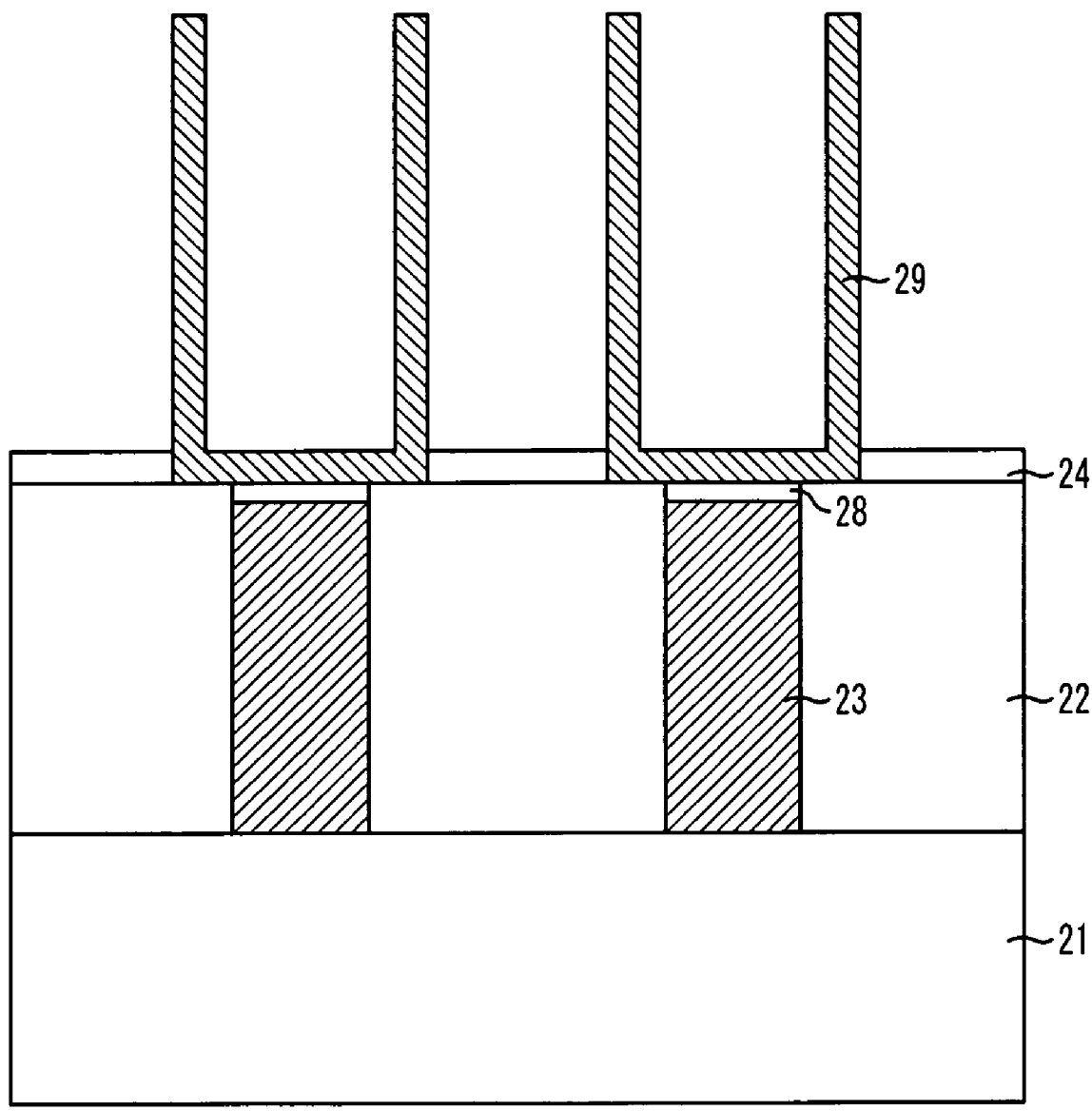

As shown in FIG. 2F, the first wet attack barrier layer 25 exposed after the removal of the sacrificial layer 26 is removed. At this time, since the first wet attack layer 25 is amorphous carbon, the amorphous carbon can be removed by using the $O_2$ plasma.

In case that the second protective barrier layer 31 is amorphous carbon, the second protective barrier layer 31 can be removed simultaneously with the removal of the first wet attack barrier layer 25. Furthermore, in case that the second protective barrier layer 31 is the second photoresist layer, it is generally known that the $O_2$ plasma introduced to remove the first protective barrier layer 25 strips a photoresist layer. Thus, during removing the first wet attach barrier layer 25, the second protective barrier layer 31 can be simultaneously removed.

As described above, in accordance with the present invention, it is possible to additionally obtain an effect of process simplicity since the first wet attack barrier layer 25 and the second protective barrier layer 31 are can be removed at once if the second protective barrier layer 31 is formed with use of the amorphous carbon or the second photoresist layer.

As mentioned above, the inner wall and the outer wall of each of the cylinder type TiN storage nodes 29 are exposed through the wet dip-out process.

Figure 2G:
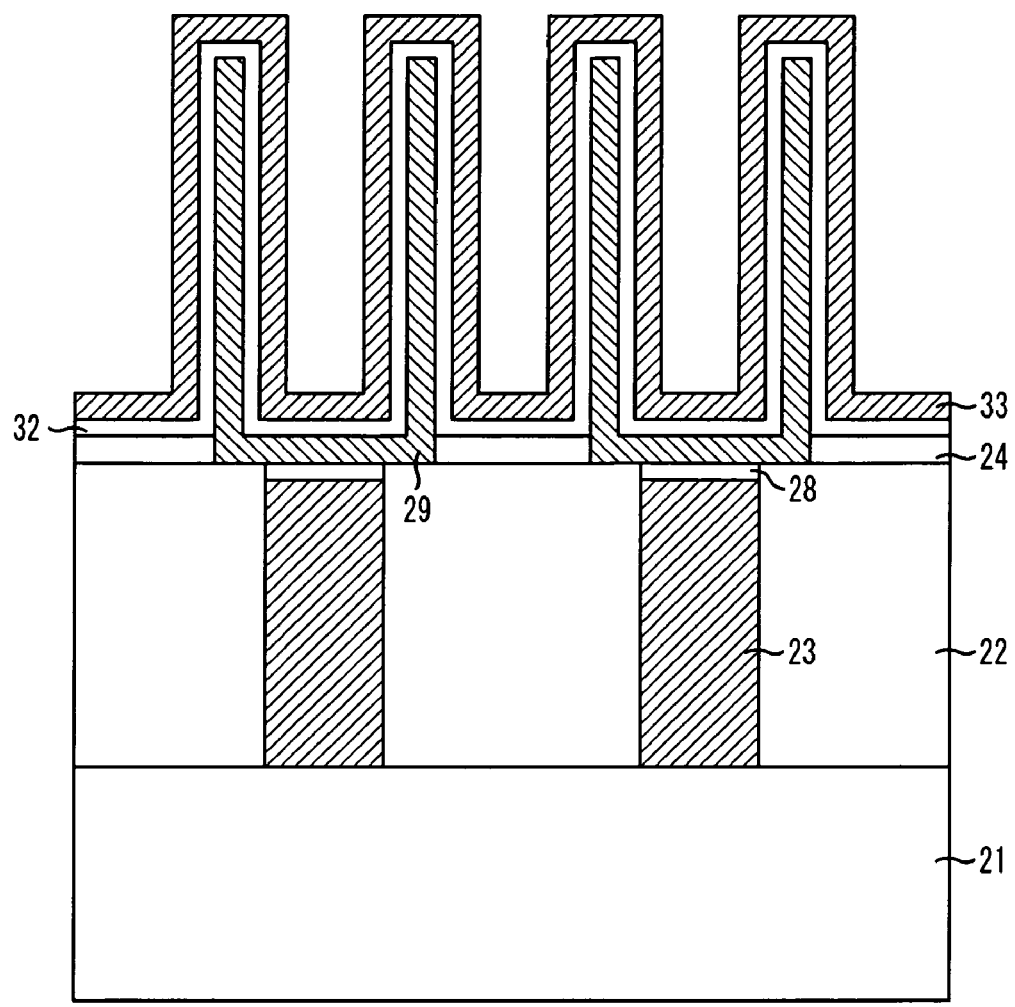

As shown in FIG. 2G, a dielectric layer 32 and a plate node 33 are sequentially formed on the exposed TiN storage nodes 29A of which the inner wall and the outer wall are exposed, thereby completing a MIM capacitor having cylinder type. At this time, the dielectric layer 32 includes a material selected from the group consisting of oxide/nitride/oxide (ONO), hafnium oxide ($HfO_2$), aluminum oxide ($Al_2O_3$) and tantalum oxide ($Ta_2O_5$), and the plate node 33 includes titanium nitride (TiN), tungsten (W), platinum (Pt) or ruthenium (Ru).

In accordance with the specific embodiment, the penetration of the wet chemical into a lower structure through the crystal grains of the TiN storage nodes 29 during the wet dip-out process of the sacrificial layer 26 or the penetration of the wet chemical into the lower structure through a surface portion of the TiN storage nodes contacting the etch barrier layer 24 are prevented by introducing the first and the second protective barrier layers 25 and 31 and thus, the bunker shaped defect generation can be prevented.

As described above, an effect of preventing the wet chemical from penetrating into the lower structure obtained through introducing the first and the second protective barrier layers 25 and 31 is not limited only to the case that the storage nodes are formed with use of TiN, but can be obtained by introducing other materials such as Pt and Ru.

Furthermore, it is possible to obtain an effect of improving wafer yields by preventing the lower structure from being damaged by the wet chemical during the wet dip-out process by introducing amorphous carbon which is a material for a protective barrier layer.

The present application contains subject matter related to the Korean patent application No. KR 2004-0113514 and the Korean patent application No. KR 2004-0113515, filed in the Korean Patent Office on Dec. 28, 2004 the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method of fabricating a semiconductor device, comprising:

forming an inter-layer insulation layer on a substrate;

forming a plurality of storage node contact plugs penetrating into the inter-layer insulation layer;

forming a stack structure formed by stacking a first protective barrier layer and a sacrificial layer on the inter-layer insulation layer, wherein the first protective barrier layer is formed by using amorphous carbon;

performing an etching process to the first protective barrier layer and the sacrificial layer in a manner to have trenches opening upper portions of the storage node contact plugs;

forming a plurality of storage nodes having a cylinder type inside of the trenches;

forming a second protective barrier layer filling the inside of the storage nodes having the cylinder type;

removing the sacrificial layer through performing a wet dip-out process;

removing the first protective barrier layer and the second protective barrier layer; and sequentially forming a dielectric layer and a plate node on the storage nodes.

2. The method of claim 1, wherein the second protective barrier layer is formed by using amorphous carbon.

3. The method of claim 2, wherein the amorphous carbon is formed at a temperature ranging from approximately 50° C. to approximately 600° C.

4. The method of claim 2, wherein the first protective barrier layer is formed in a thickness ranging from approximately 5 nm to approximately 1,000 nm.

5. The method of claim 2, wherein the removing of the first protective barrier layer and the second protective barrier layer is performed by using a plasma state of oxygen ($O_2$) gas.

6. The method of claim 5, wherein the first and the second protective barrier layers are simultaneously removed.

7. The method of claim 1, wherein the second protective barrier layer is formed by using a photoresist layer.

8. The method of claim 7, wherein the amorphous carbon formed as the first barrier layer is formed at a temperature ranging from approximately 50° C. to approximately 600° C. and has a thickness ranging from approximately 5 nm to approximately 1,000 nm and is operable to serve as a wet attack barrier layer.

9. The method of claim 7, wherein the photoresist layer is selected from the group consisting of a photoresist layer for KrF, a photoresist layer for ArF, a photoresist layer for an electron-beam, a photoresist layer for an X-ray, a photoresist layer for extreme ultraviolet (EUV) and a photoresist layer for an ion beam.

10. The method of claim 7, wherein the removing of the first protective barrier layer and the second protective barrier layer is performed by using $O_2$ plasma.

11. The method of claim 10, wherein the first and the second protective barrier layers are simultaneously removed.

12. The method of claim 1, wherein the stack structure further includes an etch barrier layer.

13. The method of claim 12, wherein the etch barrier layer is a nitride layer.

14. The method of claim 1, wherein the forming of the plurality of storage nodes includes:

forming a conductive layer on a surface of the stack structure including the trenches;

forming a passivation layer filling the inside of the trenches on the conductive layer;

selectively removing the conductive layer until the conductive layer remains on the trenches; and selectively removing the passivation layer.

15. The method of claim 14, wherein the passivation layer includes one of a photoresist layer and an undoped silicate glass (USG) layer.

16. The method of claim 14, wherein the storage nodes include titanium nitride (TiN).

17. The method of claim 1, wherein the storage nodes include TiN.

* * * * *